(12) United States Patent
Chen et al.

(10) Patent No.: US 10,886,713 B2
(45) Date of Patent: Jan. 5, 2021

(54) CONNECTION DEVICE FOR CABLE MANAGEMENT DEVICE AND SLIDE RAIL ASSEMBLY

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Wei-Chen Chang, Kaohsiung (TW); Chun-Chiang Wang, Kaohsiung (TW)

(73) Assignees: KING SLIDE WORKS CO., LTD., Kaohsiung (TW); KING SLIDE TECHNOLOGY CO., LTD., Kaohsiung (TW)

( * ) Notice: Subject to any disclaimer, the term of this patent is extended or adjusted under 35 U.S.C. 154(b) by 0 days.

(21) Appl. No.: 16/120,464

(22) Filed: Sep. 4, 2018

(65) Prior Publication Data
US 2019/0245334 A1    Aug. 8, 2019

(30) Foreign Application Priority Data
Feb. 7, 2018    (TW) .............................. 107104583 A

(51) Int. Cl.
*H02G 3/04* (2006.01)
*H05K 7/14* (2006.01)
(Continued)

(52) U.S. Cl.
CPC .......... *H02G 3/0456* (2013.01); *H02G 11/006* (2013.01); *H05K 7/1489* (2013.01);
(Continued)

(58) Field of Classification Search
CPC .. H05K 7/1491; H05K 7/1489; H05K 7/1421; H05K 7/1401; H05K 5/0013;
(Continued)

(56) References Cited

U.S. PATENT DOCUMENTS 3,905,712 A * 9/1975 McConnell .......... A47B 57/487
                                                        403/317
3,986,318 A * 10/1976 McConnell ............. F16B 12/34
                                                        403/384
(Continued)

FOREIGN PATENT DOCUMENTS

CA        3 022 485 A1    1/2018
GB        2 395 745 A     6/2004
(Continued)

*Primary Examiner* — Jonathan Liu
*Assistant Examiner* — Taylor L Morris
(74) *Attorney, Agent, or Firm* — Winston Hsu

(57) ABSTRACT

A connection device for a cable management device and a slide rail assembly is disclosed. The slide rail assembly includes a first rail and a second rail, and the first rail and the second rail are displaceable with respect to each other. The cable management device includes a first arm and a second arm. The first arm and the second arm are movable with respect to each other and respectively coupled to the first rail and the second rail by two connection devices. At least one of the connection devices includes a first fitting, a second fitting and a resilient member. When the first fitting is mounted to the second fitting, a portion of the resilient member is configured to prevent the first and second fittings from being detached from each other.

8 Claims, 8 Drawing Sheets

(51) Int. Cl.
*H02G 11/00* (2006.01)
*A47B 88/43* (2017.01)
*F16L 3/015* (2006.01)

(52) U.S. Cl.
CPC ............ *H05K 7/1491* (2013.01); *A47B 88/43* (2017.01); *F16L 3/015* (2013.01); *H02G 11/00* (2013.01)

(58) Field of Classification Search
CPC .......... F16B 12/34; F16B 21/09; F16B 12/38; A47B 88/43; A47B 2088/4235; A47B 88/427; A47B 96/06; A47B 88/423
See application file for complete search history.

(56) References Cited

U.S. PATENT DOCUMENTS

| | | | | |
|---|---|---|---|---|
| 4,090,753 A * | 5/1978 | Rock | ................ | A47B 88/956 248/243 |
| 4,681,381 A * | 7/1987 | Sevey | ................ | A47B 88/43 312/333 |
| 4,953,991 A * | 9/1990 | Rock | ................ | A47B 88/43 384/19 |
| 4,971,281 A * | 11/1990 | Steinbeck | ............ | A47B 57/42 211/192 |
| 5,025,937 A * | 6/1991 | King | ................ | A47B 57/22 211/192 |
| 6,123,314 A * | 9/2000 | Steele | ................ | F16B 5/0642 248/222.11 |
| 6,241,109 B1 * | 6/2001 | Kautz | ................ | A47B 57/50 211/192 |
| 6,273,534 B1 * | 8/2001 | Bueley | ............... | A47B 46/005 211/187 |
| 6,303,864 B1 | 10/2001 | Johnson | | |
| 6,305,556 B1 * | 10/2001 | Mayer | ................ | G06F 1/18 211/175 |
| 6,373,695 B1 * | 4/2002 | Cheng | ................ | G06F 1/184 312/223.1 |
| 6,373,707 B1 * | 4/2002 | Hutchins | ............. | G06F 1/183 211/41.17 |
| 6,422,399 B1 * | 7/2002 | Castillo | .............. | A47B 57/40 211/175 |
| 6,523,918 B1 * | 2/2003 | Baiza | ................ | H05K 7/1489 211/26 |
| 6,702,412 B2 * | 3/2004 | Dobler | ................ | A47B 88/407 312/205 |
| 6,805,248 B2 * | 10/2004 | Champion | ........... | H05K 7/1491 211/26 |
| 6,811,039 B2 * | 11/2004 | Chen | ................ | A47B 96/06 211/26 |
| 6,820,954 B2 * | 11/2004 | Judge | ................ | H05K 7/1489 312/334.11 |
| 6,866,154 B2 * | 3/2005 | Hartman | ............. | G06F 1/183 211/191 |
| 6,902,069 B2 * | 6/2005 | Hartman | ............. | H02G 3/0456 211/26 |
| 6,976,745 B2 * | 12/2005 | Dobler | ............... | A47B 88/407 312/333 |
| 7,008,030 B2 * | 3/2006 | Yang | ................ | A47B 88/477 312/334.46 |
| 7,022,916 B1 * | 4/2006 | Cavanaugh | ......... | H05K 7/1491 174/100 |
| 7,023,708 B2 * | 4/2006 | Nguyen | ............. | H05K 7/1491 174/69 |
| 7,189,924 B1 * | 3/2007 | Popescu | ............ | H05K 7/1491 174/69 |
| 7,357,362 B2 * | 4/2008 | Yang | ................ | H05K 7/1489 248/220.22 |
| 7,473,846 B2 * | 1/2009 | Doerr | ................ | H05K 7/1491 174/68.3 |
| 7,481,504 B2 * | 1/2009 | Chen | ................ | H05K 7/1489 312/330.1 |
| 7,554,819 B2 * | 6/2009 | Chen | ................ | H05K 7/1491 361/727 |
| 7,604,307 B2 * | 10/2009 | Greenwald | ........... | A47B 88/49 312/333 |
| 7,934,607 B2 * | 5/2011 | Henderson | ........... | H05K 7/1489 211/175 |
| 8,018,725 B2 * | 9/2011 | Pepe | ................ | H04Q 1/06 361/725 |
| 8,033,621 B2 * | 10/2011 | Liang | ................ | H05K 7/1489 312/334.4 |
| 8,118,267 B2 * | 2/2012 | Yu | ................ | H05K 7/1489 248/222.11 |
| 8,186,634 B2 * | 5/2012 | Chen | ................ | H02G 3/0456 248/298.1 |
| 8,562,085 B2 * | 10/2013 | Chen | ................ | A47B 88/493 312/333 |
| 8,607,993 B2 * | 12/2013 | Williams | ............. | A47B 88/00 211/26 |
| 8,622,492 B2 * | 1/2014 | Chen | ................ | F16B 21/09 312/333 |
| 8,634,198 B2 | 1/2014 | Chen | | |
| 8,701,902 B2 * | 4/2014 | Oura | ................ | H05K 7/1421 211/192 |
| 8,833,715 B2 | 9/2014 | Chen | | |
| 9,155,220 B2 * | 10/2015 | Yokosawa | ............ | H05K 7/1489 |
| 9,167,717 B2 | 10/2015 | Chen | | |
| 9,332,669 B1 * | 5/2016 | Chen | ................ | H02G 11/006 |
| 9,383,038 B2 * | 7/2016 | Chen | ................ | F16L 3/015 |
| 9,480,182 B2 * | 10/2016 | Chen | ................ | F16L 3/015 |
| 9,609,778 B1 * | 3/2017 | Spencer | ............. | H05K 7/1489 |
| 9,668,372 B2 * | 5/2017 | Chen | ................ | H05K 7/1491 |
| 9,681,574 B1 * | 6/2017 | Chen | ................ | E05B 65/44 |
| 9,867,311 B2 * | 1/2018 | Chen | ................ | F16L 3/015 |
| 9,894,793 B1 * | 2/2018 | Babcock | ............ | H05K 7/1491 |
| 2004/0079712 A1 | 4/2004 | Mayer | | |
| 2004/0108797 A1 * | 6/2004 | Chen | ................ | A47B 88/427 312/334.7 |
| 2004/0164208 A1 * | 8/2004 | Nielson | ............. | H02G 11/00 248/49 |
| 2007/0018547 A1 * | 1/2007 | Yang | ................ | A47B 88/427 312/333 |
| 2008/0246378 A1 * | 10/2008 | Chen | ................ | A47B 88/57 312/334.46 |
| 2009/0014601 A1 * | 1/2009 | Chen | ................ | H02G 3/0456 248/70 |
| 2009/0218469 A1 * | 9/2009 | Yu | ................ | H05K 7/1489 248/430 |
| 2009/0261051 A1 * | 10/2009 | Dittus | ................ | H05K 7/1489 211/207 |
| 2009/0261213 A1 | 10/2009 | Yu | | |
| 2012/0260473 A1 * | 10/2012 | Karaslahti | ............ | F16B 5/0642 24/628 |
| 2014/0158646 A1 * | 6/2014 | Chen | ................ | H05K 7/1421 211/26 |
| 2014/0334750 A1 * | 11/2014 | Fan | ................ | H05K 7/1489 384/10 |
| 2016/0330859 A1 * | 11/2016 | Chen | ................ | H05K 7/1491 |

FOREIGN PATENT DOCUMENTS

| | | |
|---|---|---|
| JP | 2-120876 U | 9/1990 |
| JP | 3094762 U | 7/2003 |
| JP | 3121054 U | 4/2006 |
| JP | 2009-259247 A | 11/2009 |
| JP | 2019-522452 A | 8/2019 |

\* cited by examiner

CONNECTION DEVICE FOR CABLE MANAGEMENT DEVICE AND SLIDE RAIL ASSEMBLY

BACKGROUND OF THE INVENTION

1. Field of the Invention

The present invention relates to a connection device, and more particularly, to a connection device for a cable management device and a slide rail assembly.

2. Description of the Prior Art

A wide range of applications exist for slide rail assemblies, examples include furniture drawers or rack systems. When used in rack systems, a slide rail assembly is typically used to carry an electronic apparatus with electronic cables that need to be supported using a cable management device. In particular, the cable management device typically has two movable arms that can be connected to the two slide rails of the aforementioned slide rail assembly.

The U.S. Pat. Nos. 8,634,198 B2, 8,833,715 B2 and 9,167,717 B2 disclose connection devices that are used with cable management devices and slide rail assemblies, and the aforesaid patents are incorporated herein for reference.

As market demands change, the connection devices used for cable management devices and slide rail assemblies require alternative designs. Therefore, developing unique products with innovative designs to satisfy specific customer needs is a topic that requires continuous effort and attention.

SUMMARY OF THE INVENTION

The present invention relates to a connection device for cable management devices and slide rail assemblies, in which the connection device provides a mechanism to easily detach slide rails and cable management devices with reduced effort.

According to one aspect of the present invention, a connection device for a cable management device and a slide rail assembly comprises a first fitting having a containing structure, the containing structure comprising a first portion and a second portion communicating with the first portion; a second fitting having a protrusion; a resilient member attached to one of the first fitting and the second fitting, the resilient member comprising a blocking part being at a locked position or an unlocked position in response to an elastic force provided by the resilient member. When the first portion of the containing structure of the first fitting is engaged with the protrusion of the second fitting, the resilient member generates an elastic force through the resilient member being manually operated or in response to the cooperation between the first fitting and the second fitting, so as to lead the blocking part to be in the unlocked position, allowing the first fitting to be released from the second fitting. When the first fitting is displaced relative to the second fitting from a first position to a second position along a first direction, the second portion of the containing structure of the first fitting is engaged with the protrusion of the second fitting, and the resilient member releases the elastic force to return the blocking part to the locked position from the unlocked position. Furthermore, the blocking part at the locked position is configured to prevent the first fitting from being detached from the second fitting along a second direction opposite the first direction.

Preferably, the first fitting comprises a first side wall, a second side wall, and a middle wall connected between the first side wall and the second side wall. The blocking part is configured on the first side wall of the first fitting when the first fitting and the second fitting are in a mutually mounted status.

Preferably, a dimension of the second portion of the containing structure is smaller than a dimension of the first portion of the containing structure. The protrusion comprises a head portion and a body portion connected to the head portion, and a dimension of the body portion is smaller than the dimension of the head portion. The dimension of the second portion of the containing structure is larger than the dimension of the body portion of the protrusion but smaller than the dimension of the head portion of the protrusion.

Preferably, the resilient member comprises a resilient part, and the blocking part protrudes from the resilient part. The resilient part has an opening to facilitate operating the resilient member so as to swing the blocking part at an angle relative to the resilient part.

According to another aspect of the present invention that is related to a cable management device and a slide rail assembly, the slide rail assembly comprises a first rail and a second rail displaceable relative to the first rail. The cable management device comprises a first arm and a second arm movably connected to the first arm. The cable management device further comprises a first connection device and a second connection device configured to connect the first arm to the first rail and the second arm to the second rail, respectively. Here, at least one of the first connection device and the second connection device comprises: a first fitting arranged on the first arm; a second fitting arranged on the first rail; and a resilient member attached to one of the first fitting and the second fitting, the resilient member comprising an resilient part and a blocking part. Additionally, the first fitting and the second fitting are mounted through a containing structure and a protrusion. When the first fitting is displaced along a first direction from a first position to a second position relative to the second fitting, the blocking part is configured to prevent the first fitting from being detached from the second fitting along a second direction opposite to the first direction.

Preferably, the first arm and the second arm both have a first end portion and a second end portion. Additionally, the first end portion of the first arm and the first end portion of second arm are pivotally connected to each other.

Preferably, the first fitting is pivotally connected to the second end portion of the first arm, and the second fitting is connected to a rear portion of the first rail.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
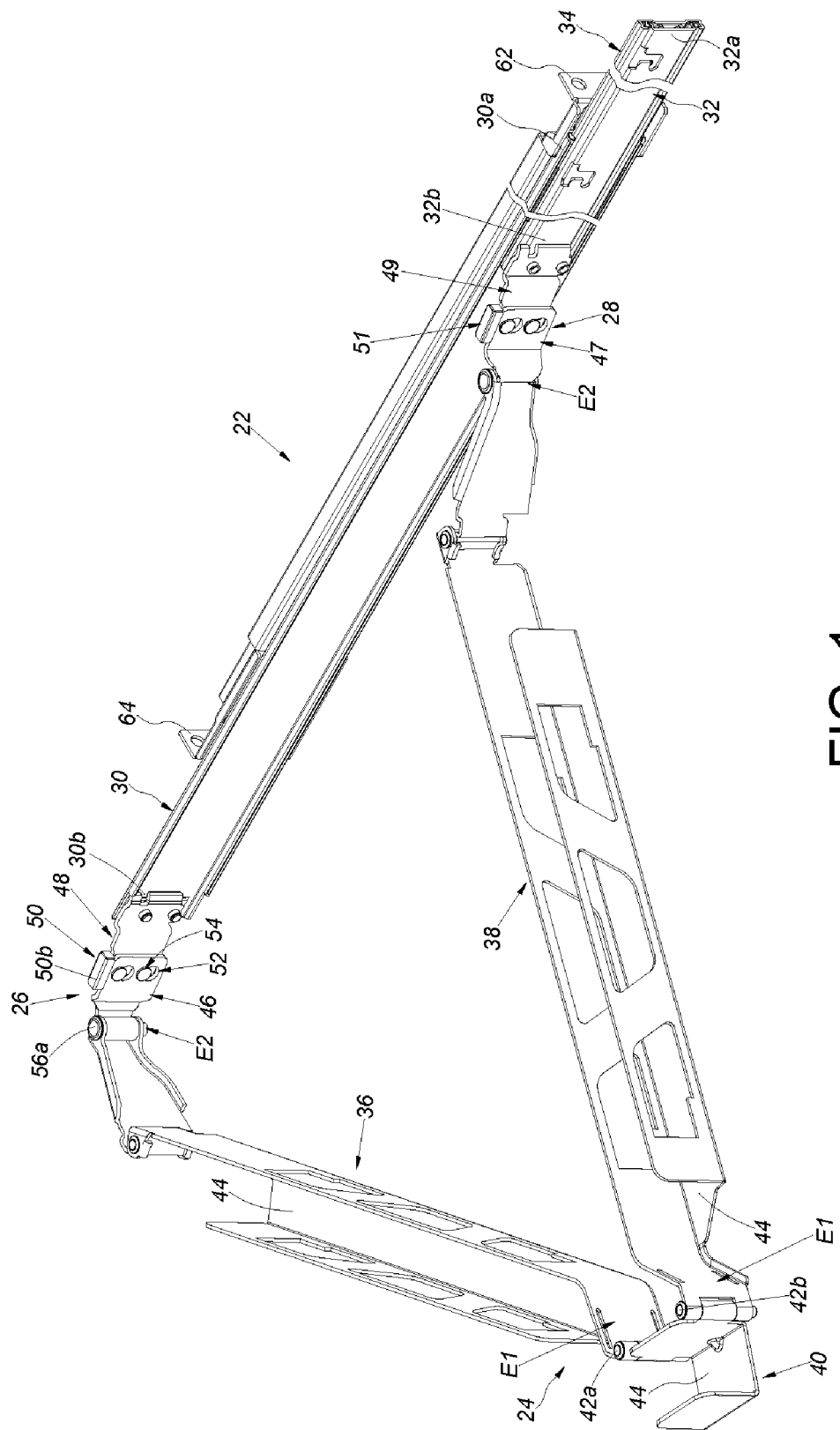
FIG. 1 is a schematic diagram illustrating a cable management device and a slide rail assembly according to an embodiment of the present invention.
Figure 2:
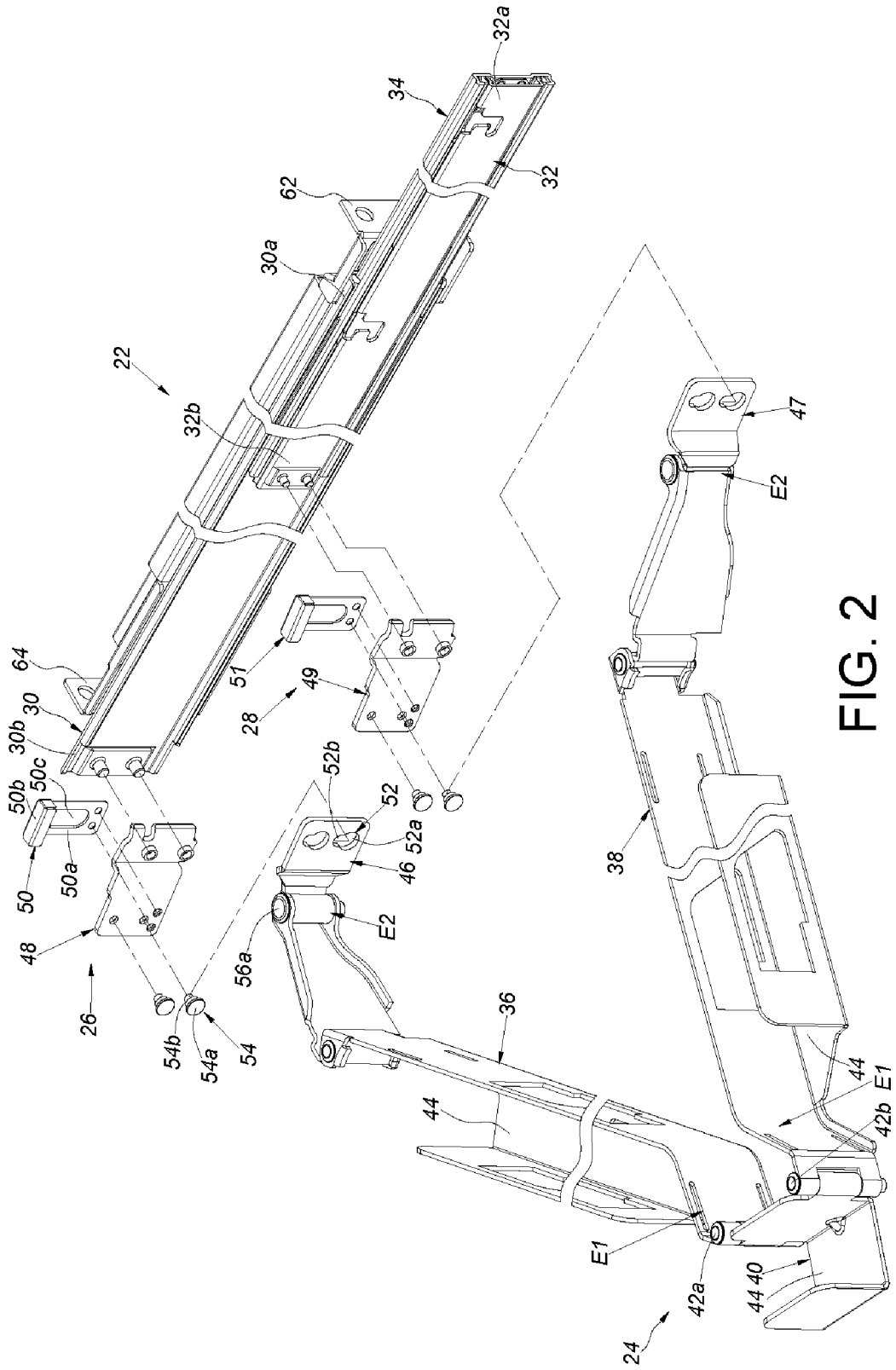
FIG. 2 is an exploded diagram illustrating a connection device according to the embodiment of the present invention.
Figure 3:
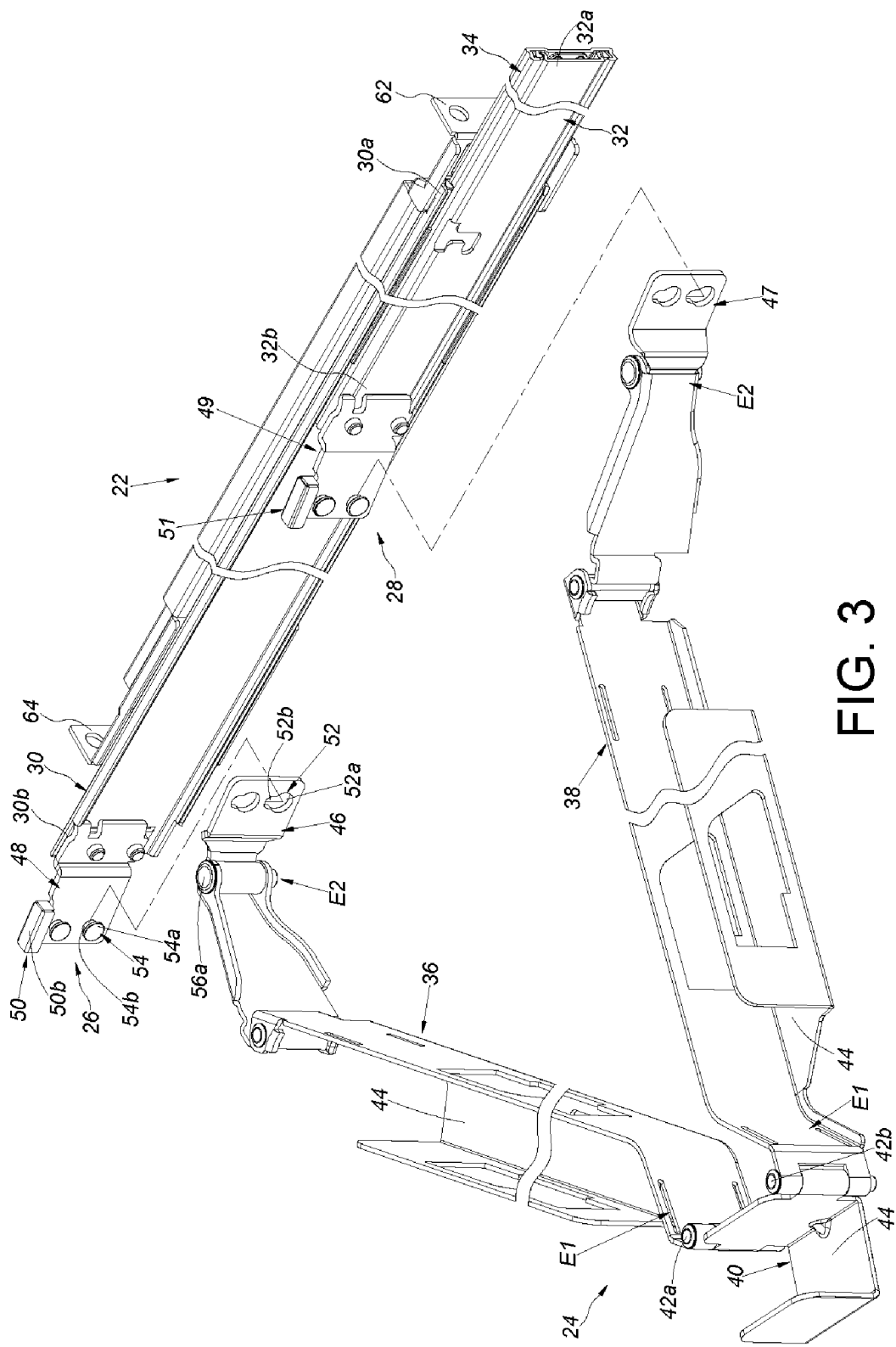
FIG. 3 is an exploded diagram illustrating the cable management device and the slide rail assembly according to the embodiment of the present invention.

As shown in FIG. 1, FIG. 2, and FIG. 3, an embodiment of the present invention comprises a slide rail assembly 22, a cable management device 24, and a first connection device 26. Preferably, the present invention further comprises a second connection device 28.

The slide rail assembly 22 comprises a first rail 30, a second rail 32 displaceable relative to the first rail 30, and preferably further comprises a third rail 34 movably connected between the first rail 30 and the second rail 32. The third rail 34 is used to extend a movement of the second rail 32 relative to the first rail 30. The first rail 30 has a front portion 30a and a rear portion 30b, and the second rail 32 has a front portion 32a and a rear portion 32b.

The cable management device 24 comprises a first arm 36 and a second arm 38. The second arm 38 is movably connected to (e.g., pivotally connected to) the first arm 36. In practical application, the first arm 36 and the second arm 38 both have a first end portion E1 and a second end portion E2 opposite to the first end portion E1. The first end portion E1 of the first arm 36 and the first end portion E1 of the second arm 38 are pivotally connected to each other. Herein, the first end portion E1 of the first arm 36 and first end portion E1 of the second arm 38 are pivotally connected to each other through a connecting base 40. That is, the first end portion E1 of the first arm 36 and the first end portion E1 of the second arm 38 are pivotally connected to each side of the connecting base 40 though a first shaft 42a and a second shaft 42b, respectively. In such configuration, a cable management feature 44 is disposed on the first arm 36, the second arm 38, and the connecting base 40 for supporting the cables of an electronic apparatus. The cable management feature 44 mentioned herein is known to those of ordinary skills in the art, and related descriptions are omitted herein for simplicity.

The first connection device 26 is configured to detachably connect the first arm 36 to the first rail 30. The second connection device 28 is used to detachably connect the second arm 38 to the second rail 32. In the present embodiment, the structural configuration of the second connection device 28 is substantially identical to that of the first connection device 26. For example, the first connection device 26 and the second connection device 28 both comprise two fittings and one resilient member. Herein, a first fitting 47 of the second connection device 28 is pivotally connected to the second end portion E2 of the second arm 38, and a second fitting 49 of the second connection device 28 is connected to the rear portion 32b of the second rail 32. Additionally, an resilient member 51 of the second connection device 28 is configured to prevent the first fitting 47 and the second fitting 49 of the second connection device 28 from being detached from a mutually mounted status. The first arm 36 is detachably connected to the first rail 30 in substantially the same principle as the second arm 38 being detachably connected to the second rail 32. For simplicity, the embodiment illustrated in the following sections will only describe the method in which the first arm 36 is detachably connected to the first rail 30 through the first connection device 26.

Figures 4, 5:
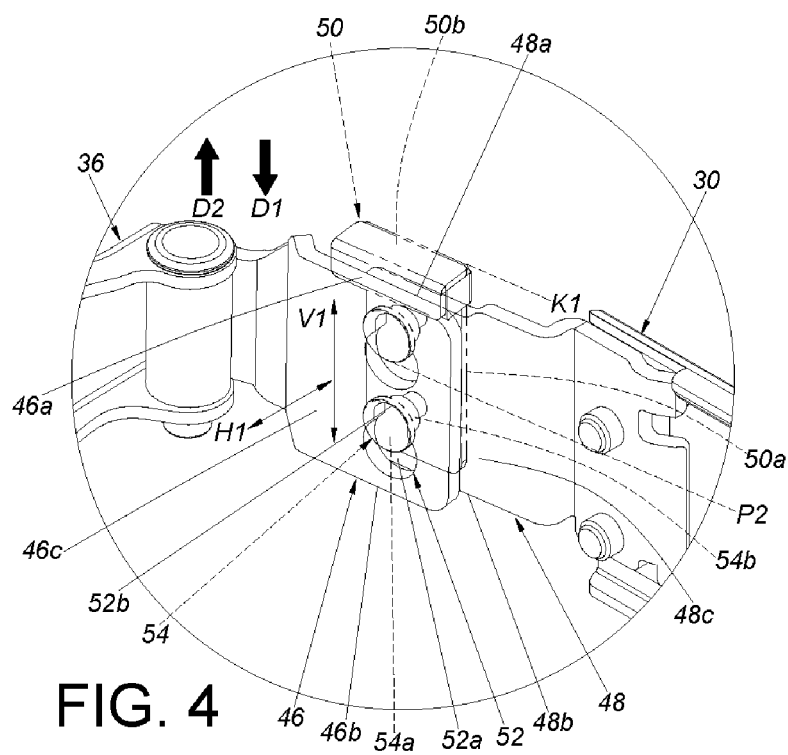
FIG. 4 is a diagram illustrating a first fitting and a second fitting of the connection device being mounted to connect an arm of the cable management device to a slide rail of the slide rail assembly according to the embodiment of the present invention.
FIG. 5 is a diagram illustrating a resilient member of the connection device being forced to swing at an angle according to the embodiment of the present invention.

In practical application, the first connection device 26 comprises a first fitting 46, a second fitting 48, and a resilient member 50. The first fitting 46 and the second fitting 48 are disposed on the first arm 36 and the first rail 30, respectively. The first fitting 46 and the second fitting 48 are mounted through an arrangement between a containing structure 52 and a protrusion 54 (as shown in FIG. 1 or FIG. 4). Preferably, the containing structure 52 is an opening or a slot. The containing structure 52 comprises a first portion 52a (or a lower portion) and a second portion 52b (or an upper portion) connected to the first portion 52a, and a dimension of the second portion 52b is smaller than a dimension of the first portion 52a. After the first portion 52a of the containing structure 52 engages with the protrusion 54 and displaced relative to each other, the containing structure 52 can be secured on the protrusion 54. Preferably, the protrusion 54 comprises a head portion 54a and a body portion 54b connected to the head portion 54a, and a dimension of the body portion 54b is smaller than a dimension of the head portion 54a. When the containing structure 52 is secured on the protrusion 54, the head portion 54a of the protrusion 54 is blocked by one side of the second portion 52b of the containing structure 52 (as shown in FIG. 1 or FIG. 4).

The first fitting 46 having the containing structure 52 and the second fitting 48 with the protrusion 54 is illustrative of an example hereinafter. In the present embodiment, two containing structures 52 and two protrusions 54 are illustrated, but the present invention is not limited thereto. Furthermore, the first fitting 46 is pivotally connected to the second end portion E2 on the first arm 36 through a pivoting member 56a, and the second fitting 48 is connected to the rear portion 30b on the first rail 30. The second fitting 48 can be secured onto the first rail 30 using screws, latches and so on. Alternatively, the second fitting 48 can be riveted or welded onto the first rail 30. In other words, the second fitting 48 can be viewed as a part of the first rail 30 after the second fitting 48 is secured to the first rail 30.

The resilient member 50 of the first connection device 26 is attached to one of the first fitting 46 and the second fitting 48. As an example, the resilient member 50 can be a flat spring. In practical application, components with elasticity or flexibility are within the scope of the present invention. The resilient member 50 comprises a resilient part 50a and a blocking part 50b. The blocking part 50b is disposed on the resilient part 50a of the resilient member 50. Preferably, the blocking part 50b is extended from the resilient part 50a, and even more preferably, the blocking part 50b of the resilient member 50 protrudes from the resilient part 50a.

Figure 6:
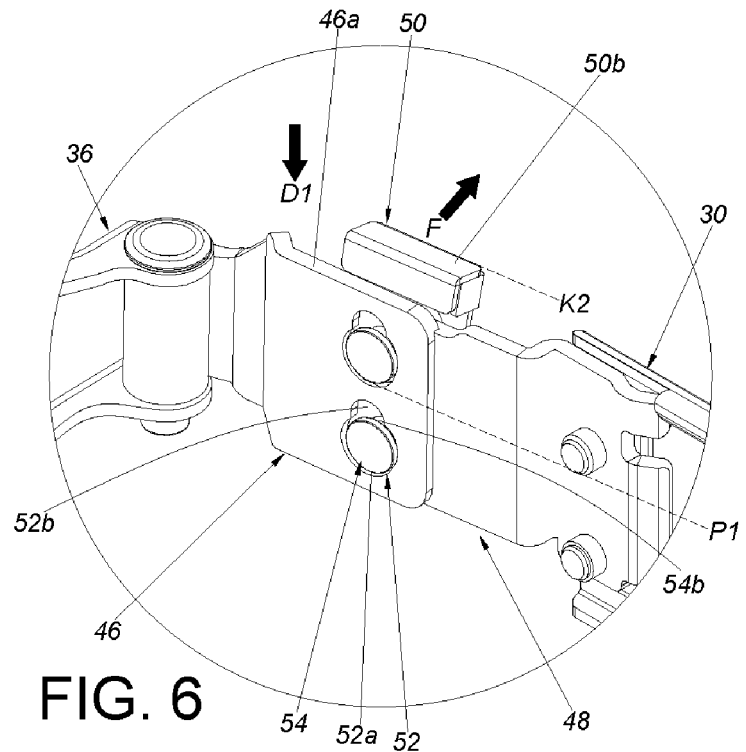
FIG. 6 is a diagram illustrating the first fitting and the second fitting being detached from a mutually mounted status after the resilient member of the connection device generates an elastic force according to the embodiment of the present invention.

When the first fitting 46 is displaced relative to the second fitting 48 along a first direction D1 from a first position P1 (as shown in FIG. 6) to a second position P2 (as shown in FIG. 4), the blocking part 50b configured to one of the first fitting 46 and the second fitting 48 is configured to prevent the first fitting 46 from being detached from the second fitting 48 (as shown in FIG. 1 or FIG. 4).

As shown in FIG. 4, the first fitting 46 and the second fitting 48 comprises a first side wall (or an upper side wall), a second side wall (or a lower side wall) corresponding to the first side wall, and a middle wall connected between the first side wall and the second side wall.

In practical application, the first fitting 46 comprises a first side wall 46a (or an upper side wall), a second side wall 46b (or a lower side wall), and a middle wall 46c connected between the first side wall 46a and the second side wall 46b. On the other hand, the second fitting 48 comprises a first side wall 48a (or an upper side wall), a second side wall 48b (or a lower side wall), and a middle wall 48c connected between the first side wall 48a and the second side wall 48b.

In the present embodiment, the containing structure 52 is configured on the middle wall 46c of the first fitting 46; the protrusion 54 is configured on the middle wall 48c of the second fitting 48; the resilient member 50 is attached to the second fitting 48. As an example, one end of the resilient part 50a of the resilient member 50 is connected to a back side (that is, a side away from the first fitting 46) of the middle wall 48c of the second fitting 48.

When the first fitting 46 and the second fitting 48 are in the mutually mounted status, the blocking part 50b is located above the first side wall 46a of the first fitting 46. At this time, the blocking part 50b is at a locked position K1 to prevent the first fitting 46 from being detached from the second fitting 48 along a second direction D2 opposite the first direction D1.

Figure 7:
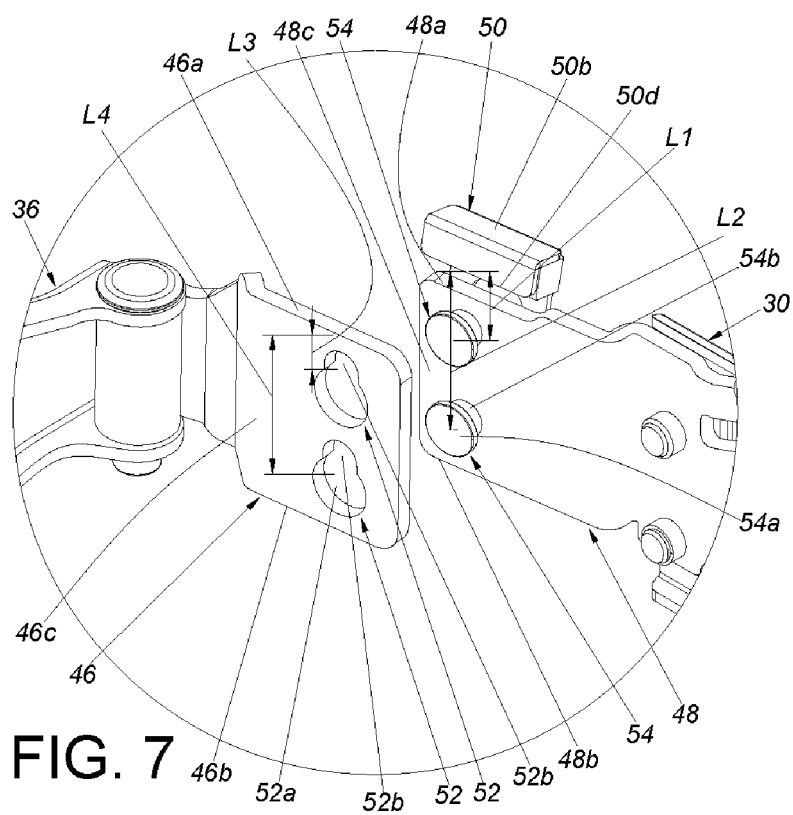
FIG. 7 is a diagram illustrating the cable management device and the slide rail being detached after the first fitting and the second fitting are detached from the mutually mounted status according to the embodiment of the present invention.

As shown in FIG. 5, FIG. 6, and FIG. 7, when the first fitting 46 is desired to detach from the second fitting 48, a force F can be applied to the resilient member 50 so as to generate an elastic force to swing the blocking part 50b relative to the resilient part 50a and release the blocking part 50b from above the first side wall 46a of the first fitting 46 (as shown in FIG. 5). At this time, the blocking part 50b is moved from the locked position K1 to an unlocked position K2. In such configuration, the first arm 36 can be displaced along the second direction D2 relative to the first rail 30, thereby allowing the head portion 54a of the protrusion 54 to be returned from the second portion 52b of the containing structure 52 to the first portion 52a of the containing structure 52 (as shown in FIG. 6). This allows the first arm 36 and the first rail 30 to be detached relative to each other (as shown in FIG. 7). Specifically, the blocking part 50b can respond to the elastic force of the resilient member 50 and be configured in a locked position K1 or an unlocked position K2. When the first portion 52a of the containing structure 52 of the first fitting 46 is engaged with the protrusion 54 of the second fitting 48, the resilient member 50 can generate an elastic force through the resilient member 50 being manually operated or in response to the cooperation between the first fitting 46 and the second fitting 48, leading to the blocking part 50b to be in the unlocked position K2 such that the first fitting 46 can be released from the second fitting 48. When the first fitting 46 is displaced relative to the second fitting 48 along a first direction D1 from a first position P1 to a second position P2, the second portion 52b of the containing structure 52 of the first fitting 46 is located at a position corresponding to the protrusion 54 of the second fitting 48. By releasing the elastic force of the resilient member 50, the blocking part 50b is returned to the locked position K1 from the unlocked position K2, such that the blocking part 50b is configured to prevent the first fitting 46 from being released from the second fitting 48 along a second direction D2 opposite the first direction D1.

Please refer to FIG. 7, FIG. 6, and FIG. 4 in sequence. It is noticed that when the first arm 36 and the first rail 30 should be mounted once again, the first arm 36 and the first rail 30 can be brought closer together. At the same time, the resilient member 50 can be slightly pushed by force F or be operated to sustain an elastic force (as shown in FIG. 6). Furthermore, when the first fitting 46 cooperates with the cable management device 24 (or the first arm 36) and mount to the second fitting 48 in the first direction D1 (that is, a downward direction), the body portion 54b of the protrusion 54 is inserted and mounted to the second portion 52b from the first portion 52a of the containing structure 52 (as shown in FIG. 4). By releasing the elastic force of the resilient member 50, the blocking part 50b can block the first side wall 46a of the first fitting 46 to prevent the first fitting 46 from being released from the second fitting 48 in a second direction D2 (that is, an upward direction) opposite to the first direction D1 (as shown in FIG. 4). It should be noted that the aforementioned first direction D1 and second direction D2 are for illustrative purposes only. In practical application, the first direction D1 and the second direction D2 can be opposite to each other, and the present invention is not limited thereto. It should also be noted that the dimension of the second portion 52b of the containing structure 52 is larger than the dimension of the body portion 54b of the protrusion 54 but smaller than the dimension of the head portion 54a of the protrusion 54. Therefore, when the first fitting 46 and the second fitting 48 are mounted according to FIG. 4, the fittings cannot be displaced along a horizontal direction (H1) and a vertical direction (V1), allowing the fittings to be stable and fixed. Additionally, the resilient part 50a of the resilient member 50 has an opening 50c (as shown in FIG. 2) that allows the resilient member 50 to be more easily pushed by a force F or be operated to sustain the elastic force (as shown in FIG. 5 and FIG. 6). A user can then operate the resilient member 50 with less effort, allowing the blocking part 50b to swing at an angle relative to the resilient part 50a and facilitate mounting the first fitting 46 and the second fitting 48.

As shown in FIG. 7, the blocking part 50b of the resilient member 50 has a lower edge 50d, the lower edge 50d cooperates with the first side wall 46a of the first fitting 46. The second fitting 48 is configured with two protrusions 54. One of the two protrusions 54 is disposed next to the first side wall 48a of the second fitting 48, and the other of the two protrusions 54 is disposed next to the second side wall 48b of the second fitting 48. The first fitting 46 is configured with two containing structures 52. One of the two containing structures 52 is disposed next to the first side wall 46a of the first fitting 46, and the other of the two containing structures 52 is disposed next to the second side wall 46b of the second fitting 46. The lower edge 50d of the blocking part 50b is spaced from the one of the two protrusions 54 by a first spacing L1. The lower edge 50d of the blocking part 50b is spaced from the other of the two protrusions 54 by a second spacing L2. The first side wall 46a of the first fitting 46 is spaced from one of the two containing structures 52 by a third spacing L3, and the first side wall 46a of the first fitting 46 is spaced from the other of the two containing structures 52 by a fourth spacing L4, wherein the first spacing L1 is substantially equal to the third spacing L3, and the second spacing L2 is substantially equal to the fourth spacing L4.

Figure 8:
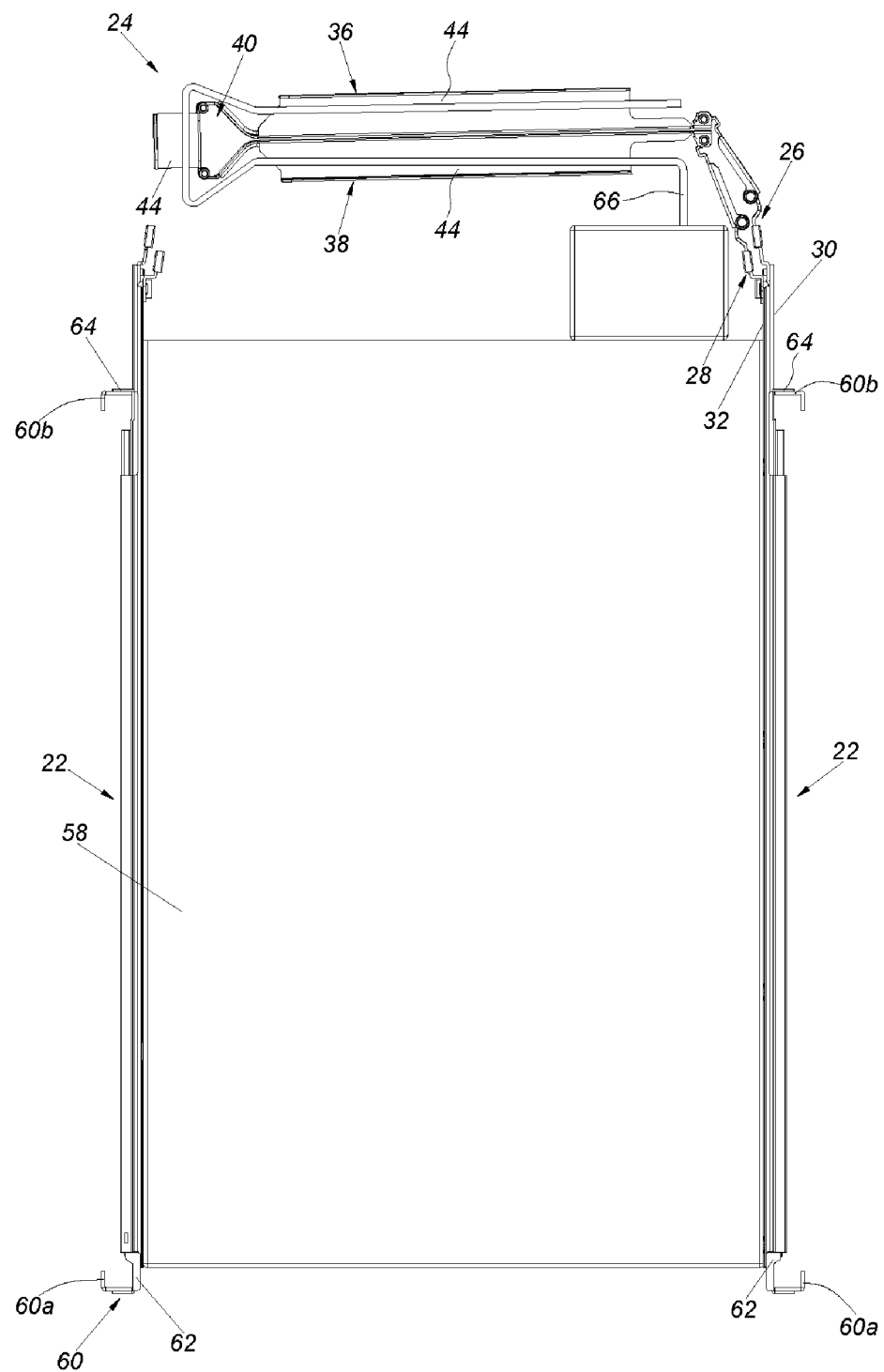
FIG. 8 is a diagram illustrating the cable management device being mounted on a side of a rack system according to the embodiment of the present invention.

As shown in FIG. 8, an electronic apparatus 58 on a rack system can be stored inside a rack 60 through the retraction of the second rail 32 of a pair of slide rail assemblies 22 relative to the first rail 30. Herein, the first arm 36 and the second arm 38 retract relative to each other. In practical application, the electronic apparatus 58 can be mounted on the rack 60 using a pair of slide rail assemblies 22, and the first rail 30 of each slide rail assembly 22 is mounted to the first rack post 60a and the second rack post 60b through a first bracket 62 and a second bracket 64, respectively. The second rail 32 can carry the electronic apparatus 58, and the electronic apparatus 58 typically is configured with cables 66. Furthermore, the cable management feature 44 of the first cable management arm 36, the second cable management arm 38, or the connecting base 40 on the cable management device 24 can be used to support the aforementioned cables 66. The cable management feature 44 mentioned herein is obvious to those of ordinary skill in the art, and related descriptions are omitted herein for simplicity. In the present configuration, the cable management device 24 is detachably connected to one of the pair of the slide rail assemblies 22 (as shown in FIG. 8, the cable management device 24 is detachably connected to the slide rail assembly 22 on a right side of the rack 60). In practical application, the first connection device 26 can detachably connect the first arm 36 to the first rail 30, and the second connection device 28 can detachably connect the second arm 38 to the second rail 32.

Figure 9:
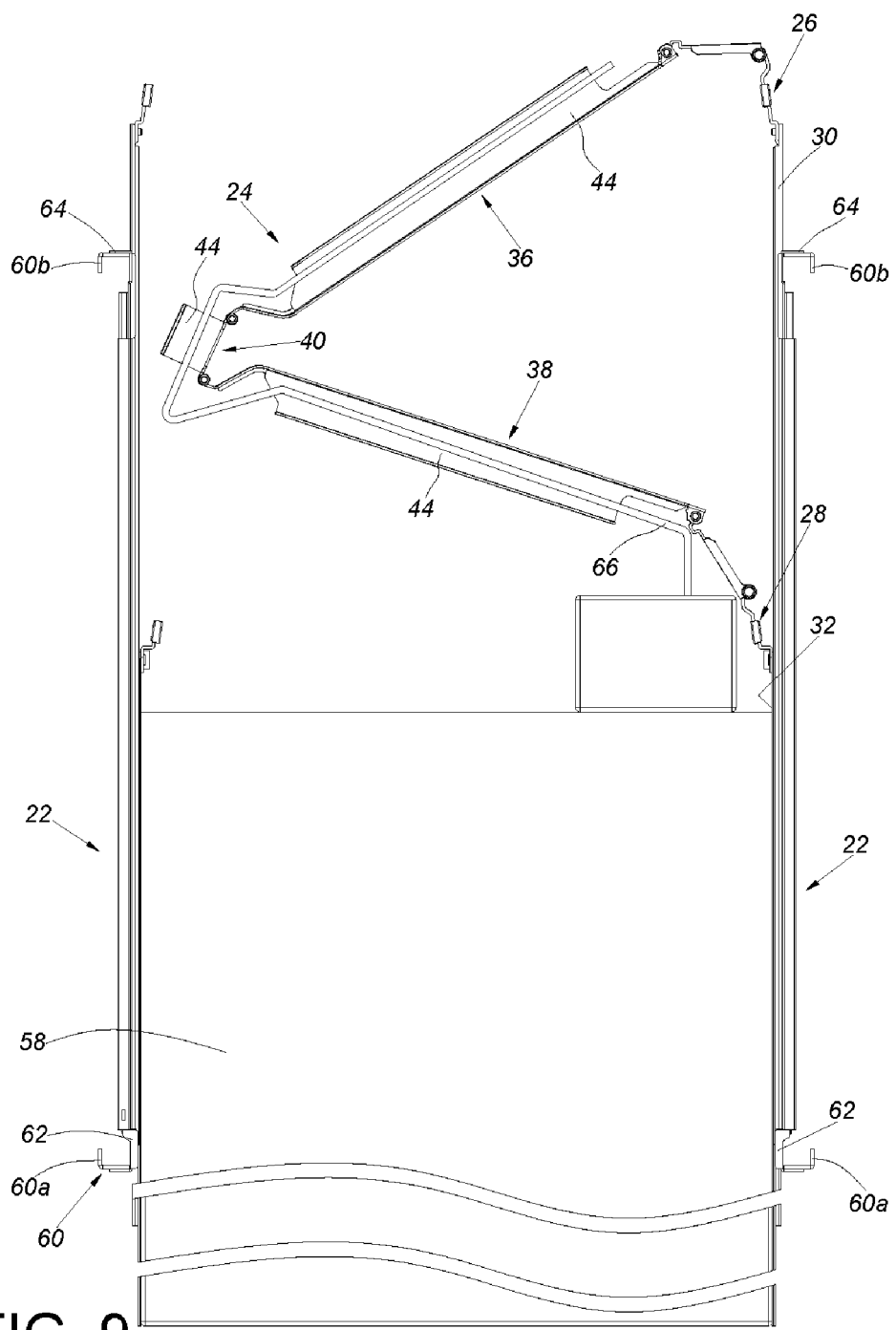
FIG. 9 is a diagram illustrating an electronic apparatus being pulled out of the rack system along an open direction through the slide rail of the slide rail assembly according to the embodiment of the present invention.

As shown in FIG. 9, the electronic apparatus 58 can be pulled out of the rack 60 from inside the rack 60 through the displacement of the second rail 32 of the pair of slide rail assemblies 22 relative to the first rail 30. Herein, the first arm 36 and the second arm 38 pivot and extend relative to each other.

Figure 10:
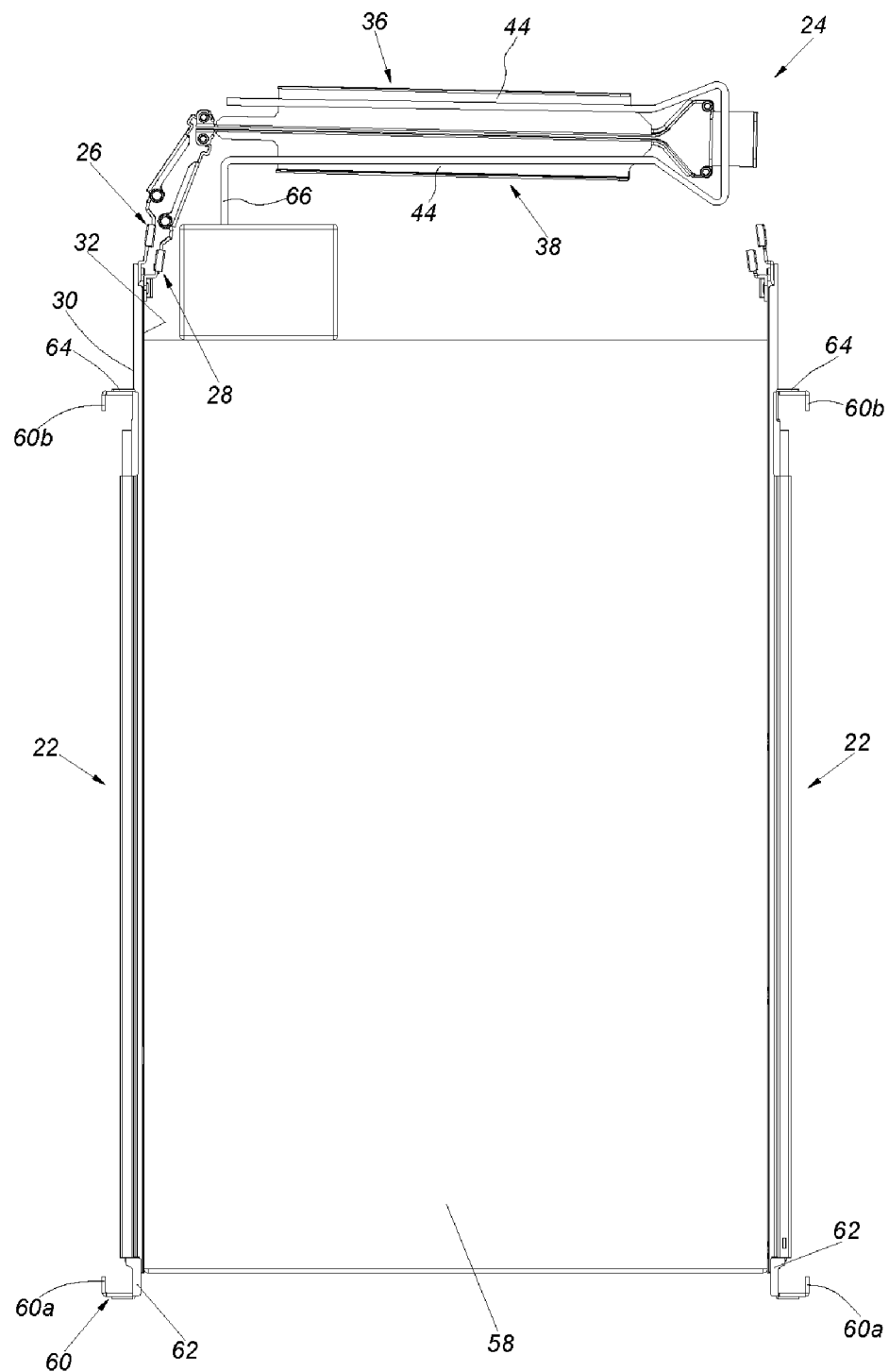
FIG. 10 is a diagram illustrating the cable management device being mounted on another side of the rack system according to the embodiment of the present invention.

As shown in FIG. 10, a mechanism to detach a slide rail and an arm from each other is provided through the aforementioned first connection device 26 and second connection device 28. In an alternative embodiment, the cable management device 24 is detachably connected to the slide rail assembly 22 on a left side of the rack 60. For example, the first connection device 26 can detachably connect the first arm 36 to the first rail 30 of the slide rail assembly 22 on the left side of the rack 60, and the second connection device 28 can detachably connect the second arm 38 to the second rail 32 of the slide rail assembly 22 on the left side of the rack 60.

It can be seen from the aforementioned embodiments that the present invention includes the following advantages:

1. The resilient member 50 of the first connection device 26 is attached to one of the first fitting 46 and the second fitting 48. When the first fitting 46 is mounted to the second fitting 48, the blocking part 50b located on another one of the first fitting 46 and the second fitting 48 can be used to prevent the first fitting 46 from being released from the second fitting 48.

2. The resilient part 50a of the resilient member 50 has the opening 50c that allows the resilient member 50 to be more easily pushed by a force F or be operated to sustain the elastic force. A user can then operate the resilient member 50 with less effort, allowing the blocking part 50b to swing at an angle relative to the resilient part 50a and facilitate mounting the first fitting 46 and the second fitting 48.

3. A mechanism to detach an arm and a slide rail (for example, the first arm 36 and the first rail 30, or the second arm 38 and the second rail 32) from each other is provided through the first connection device 26 or the second connection device 28.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A cable management device and a slide rail assembly, the slide rail assembly comprising a first rail and a second rail displaceable relative to the first rail, the cable management device comprising a first arm, a second arm movably connected to the first arm, a first connection device configured to connect the first arm to the first rail, and a second connection device configured to connect the second arm to the second rail, at least one of the first connection device and the second connection device comprising:

a first fitting arranged on the first arm, the first fitting comprising one of a containing structure and a protrusion;

a second fitting arranged on the first rail, the second fitting comprising the other one of the containing structure and the protrusion; and a resilient member attached to one of the first fitting and the second fitting, the resilient member comprising a resilient part and a blocking part, and an opening is formed on the resilient part to facilitate deforming the resilient member elastically;

wherein the blocking part, the opening, and the resilient part are connected as a one-piece member;

wherein the first fitting and the second fitting are mounted through the containing structure and the protrusion;

wherein the blocking part further comprises a lower edge;

wherein the first fitting further comprises a first side wall, a second side wall, and a middle wall connected between the first side wall and the second side wall, the first side wall of the first fitting and the second side wall of the first fitting forming two exterior faces of the first fitting;

wherein the second fitting further comprises a first side wall, a second side wall, and a middle wall connected between the first side wall and the second side wall, the first side wall of the second fitting and the second side wall of the second fitting forming two exterior faces of the second fitting;

wherein when the first fitting is displaced relative to the second fitting along a first direction from a first position to a second position, the blocking part is configured to prevent the first fitting from being detached from the second fitting along a second direction opposite to the first direction;

wherein when the blocking part is configured to prevent the first fitting from being detached from the second fitting along a second direction opposite to the first direction, the blocking part, the containing structure, and the protrusion are aligned with one another;

wherein the blocking part is configured on the first side wall of the first fitting and the first side wall of the second fitting via the lower edge of the blocking part when the first fitting and the second fitting are in a mutually mounted status;

wherein when the first fitting is to detach from the second fitting, the blocking part is swung relative to the resilient part at an angle relative to the resilient part to release the blocking part from above the first side wall of the first fitting.

2. The cable management device and the slide rail assembly of claim 1, wherein the first arm and the second arm both have a first end portion and a second end portion, the first end portion of the first arm and the first end portion of the second arm are pivotally connected to each other.

3. The cable management device and the slide rail assembly of claim 2, wherein the first fitting is pivotally connected to the second end portion of the first arm, and the second fitting is connected to a rear portion of the first rail.

4. The cable management device and the slide rail assembly of claim 1, wherein the resilient member is attached to the second fitting.

5. The cable management device and the slide rail assembly of claim 4, wherein the lower edge of the blocking part is spaced from the protrusion by a spacing, the first side wall of the first fitting is spaced from the containing structure by another spacing, the spacing is substantially equal to the another spacing.

6. The cable management device and the slide rail assembly of claim 1, wherein the containing structure comprises a first portion and a second portion connected to the first portion, a dimension of the second portion of the containing structure is smaller than a dimension of the first portion of the containing structure, the protrusion comprises a head portion and a body portion connected to the head portion, a dimension of the body portion is smaller than a dimension of the head portion, the dimension of the second portion of the containing structure is larger than the dimension of the body portion of the protrusion but smaller than the dimension of the head portion of the protrusion.

7. The cable management device and the slide rail assembly of claim 1, wherein the blocking part protrudes from the resilient part.

8. The cable management device and the slide rail assembly of claim 1, wherein when the blocking part is configured to prevent the first fitting from being detached from the second fitting along a second direction opposite to the first direction, the blocking part, the containing structure, and the protrusion are aligned with one another along a vertical direction.

\* \* \* \* \*